(12) United States Patent
Ishikawa et al.

(10) Patent No.: US 7,285,854 B2
(45) Date of Patent: Oct. 23, 2007

(54) WIRE BONDING METHOD AND SEMICONDUCTOR DEVICE

(75) Inventors: Katsumi Ishikawa, Takahama (JP); Nobuya Makino, Anjo (JP); Hiroshi Takei, Anjo (JP)

(73) Assignee: DENSO Corporation, Kariya (JP)

( * ) Notice: Subject to any disclaimer, the term of this patent is extended or adjusted under 35 U.S.C. 154(b) by 102 days.

(21) Appl. No.: 11/063,866

(22) Filed: Feb. 24, 2005

(65) Prior Publication Data
US 2005/0205995 A1    Sep. 22, 2005

(30) Foreign Application Priority Data
Mar. 18, 2004    (JP) .............................. 2004-078244

(51) Int. Cl.
H01L 23/48    (2006.01)
H01L 23/52    (2006.01)
H01L 29/40    (2006.01)

(52) U.S. Cl. .................. 257/738; 257/737; 257/784

(58) Field of Classification Search ................. 257/784, 257/777, 737, 686, 738; 438/617
See application file for complete search history.

(56) References Cited

U.S. PATENT DOCUMENTS

| | | | |
|---|---|---|---|
| 6,079,610 A | | 6/2000 | Maeda et al. |
| 6,215,182 B1 * | | 4/2001 | Ozawa et al. ............... 257/723 |
| 6,882,056 B2 * | | 4/2005 | Komiyama et al. .......... 257/777 |
| 6,921,016 B2 * | | 7/2005 | Takahashi ................. 228/180.5 |
| 2002/0158325 A1 | | 10/2002 | Yano et al. |
| 2003/0155660 A1 | | 8/2003 | Takahashi et al. |
| 2003/0166333 A1 | | 9/2003 | Takahashi |
| 2003/0230796 A1 * | | 12/2003 | Ismail et al. ................. 257/686 |

FOREIGN PATENT DOCUMENTS

| | | |
|---|---|---|
| JP | A-10-229100 | 8/1998 |
| JP | A-11-233543 | 8/1999 |
| JP | A-2000-114452 | 4/2000 |
| JP | A-2000-124391 | 4/2000 |

OTHER PUBLICATIONS

First Office Action from Chinese Patent Office issued on Dec. 8, 2006 for the corresponding Chinese patent application No. 200510054299.X (a copy and English translation thereof).

* cited by examiner

*Primary Examiner*—Shouxiang Hu
(74) *Attorney, Agent, or Firm*—Posz Law Group, PLC

(57) ABSTRACT

A wire bonding method for bonding a plurality of conducting wires to connect first conductors and second conductors has the following steps. 1) Bonding a first conducting ball on a first first conductor. 2) Bonding a first conducting wire on the first conducting ball, the first conducting wire being connected to a first second conductor. 3) Bonding a second conducting ball on a second first conductor. 4) Bonding a second conducting wire on the second conducting ball, the second conducting wire being connected to a second second conductor. Here, the second first conductor or the second second conductor is the first conducting wire bonded on the first conducting ball.

5 Claims, 6 Drawing Sheets

WIRE BONDING METHOD AND SEMICONDUCTOR DEVICE

CROSS REFERENCE TO RELATED APPLICATION

This application is based upon and claims the benefit of priority of Japanese Patent Application No. 2004-078244 filed on Mar. 18, 2004, the content of which is incorporated herein by reference.

FIELD OF THE INVENTION

The present invention relates to a wire bonding method for a semiconductor device and a semiconductor device manufactured by such a method.

BACKGROUND OF THE INVENTION

Conventional semiconductor power device such as a laterally diffused MOS (LDMOS) has a plurality of chip electrodes on a semiconductor chip located therein to regulate a large current thereby. The power device also has an interconnection having dimensions for connecting a plurality of gold (Au) wires thereon. The Au wires connect the chip electrodes and the interconnection by wire bonding method. In this case, a plurality of Au wires (for example, three Au wires) is bonded to connect the same number of chip electrodes (for example, three electrodes) and the interconnection by wire bonding method as shown in JP10-229100A.

The power devices require many chip electrodes on the semiconductor chip to flow a large current therein. This makes the dimensions of the semiconductor chip and the semiconductor device large.

SUMMARY OF THE INVENTION

An object of the present invention is to provide a wire bonding method and a semiconductor device manufactured by such a method, which has a semiconductor chip having a small number of chip electrodes to reduce the dimension thereof.

To achieve the above object, the wire bonding method for bonding a conducting wire to connect first conductors and second conductors comprises the following steps. 1) Bonding a first conducting ball on a first first conductor. 2) Bonding a first conducting wire on the first conducting ball, the first conducting wire being connected to a first second conductor. 3) Bonding a second conducting ball on a second first conductor. 4) Bonding a second conducting wire on the second conducting ball, the second conducting wire being connected to a second second conductor. Here, the second first conductor or the second second conductor is the first conducting wire bonded on the first conducting ball.

BRIEF DESCRIPTION OF THE DRAWINGS

Other features and advantages of the present invention will be appreciated, as well as methods of operation and the function of the related parts, from a study of the following detailed description, the appended claims, and the drawings, all of which form a part of this application. In the drawings:

DESCRIPTION OF THE PREFERRED EMBODIMENTS

A first embodiment applying the present invention in a power device will be described with reference to FIGS. 1 to 8.

Figure 1:
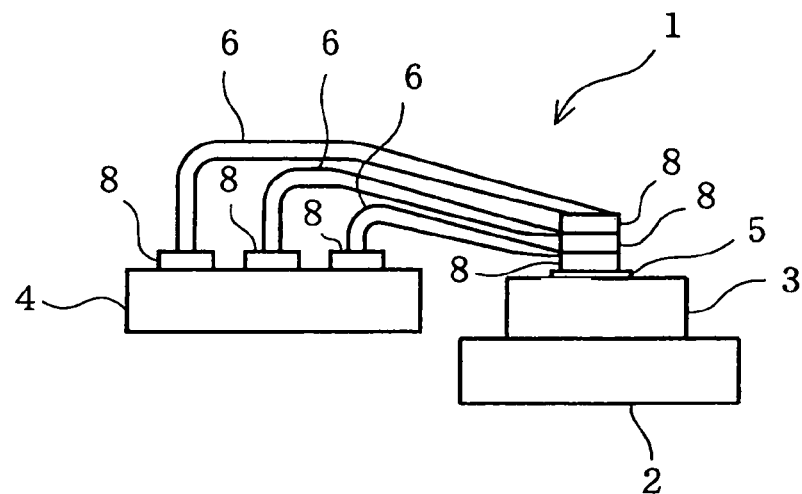
FIG. 1 is a side view showing a semiconductor device and a manufacturing method of the semiconductor device according to a first embodiment of the present invention.

As shown in FIG. 1, a semiconductor device 1 in this embodiment generally has an island 2 for fixing a chip thereon, a semiconductor chip 3 located on the island 2 and an interconnection 4. The semiconductor chip 3 may be an IGBT or power MOSFET. Three Au wires 6 connect a chip electrode (pad) 5 provided on the semiconductor chip 3 and the interconnection 4 with wire bonding method.

The process of wire bonding the Au wires 6 between the interconnection 4 and the chip electrode 5 will be described with reference to FIGS. 2 to 8.

Figure 2:
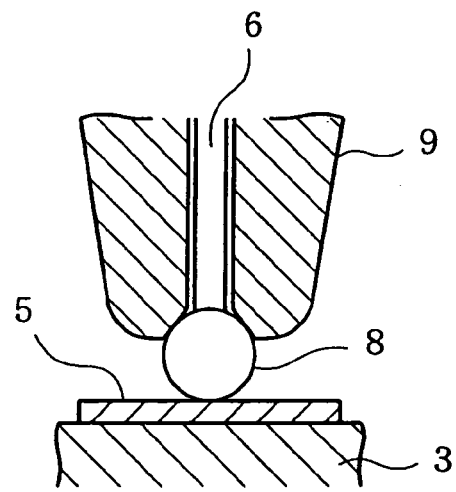
FIG. 2 is a vertical-sectional view showing a first process of ball-bonding an Au wire to form a bump on a pad according to the first embodiment.
Figure 3:
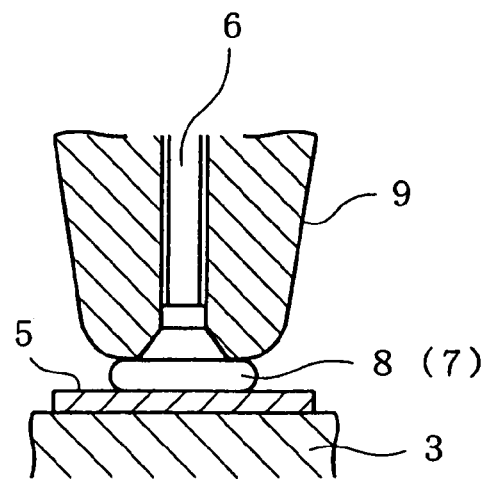
FIG. 3 is a vertical-sectional view showing a second process of forming the bump on the electrode according to the first embodiment.
Figure 4:
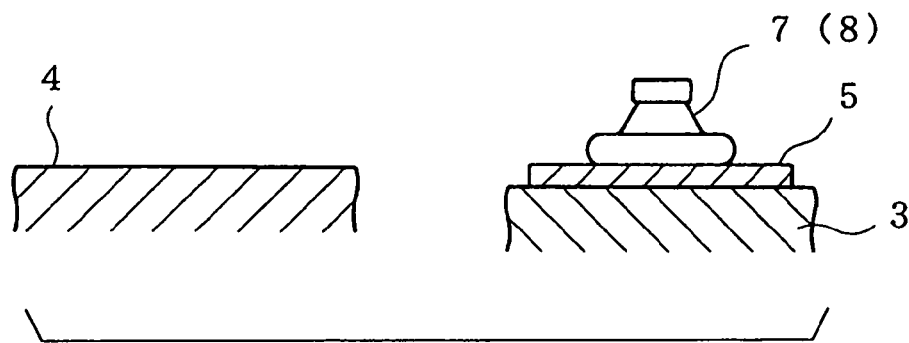
FIG. 4 is a vertical-sectional view showing a completion state of forming the bump on the electrode according to the first embodiment.

First, as shown in FIG. 4, a bump 7 is formed on the chip electrode 5 by ball-bonding the Au wire 6. This ball-bonding process is shown in FIGS. 2 and 3. As shown in FIG. 2, a capillary 9 for feeding the Au wire 6 forms at a head (a bottom end) thereof an Au ball 8 and puts the Au ball 8 down on the chip electrode 5. Then, as shown in FIG. 3, the capillary 9 affixes the Au ball 8 on the chip electrode 5 plastically deforming the Au ball 8 into the bump 7 by applying thereto a pressure and an ultrasonic wave. The capillary 9 has a conical hollow at the head so that the bump 7 is formed into an approximately conical shape. The capillary 9 pulls and cuts the Au wire 6 off the bump 7 into a state shown in FIG. 4.

In the above process of cutting the Au wire, it is desirable to lift the head of capillary 9 by a predetermined height and then to move the head laterally and slightly closer to the chip electrode 5. The above process forms the bump 7 on the chip electrode 5 of the semiconductor chip 3.

Figure 5:
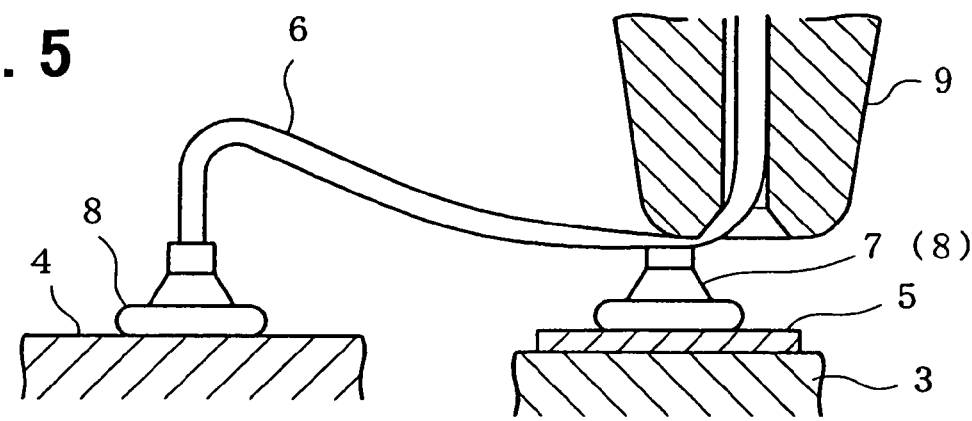
FIG. 5 is a vertical-sectional view showing a process of ball-bonding a first Au wire on a pad portion and wedge-bonding the first Au wire on the bump according to the first embodiment.
Figure 6:
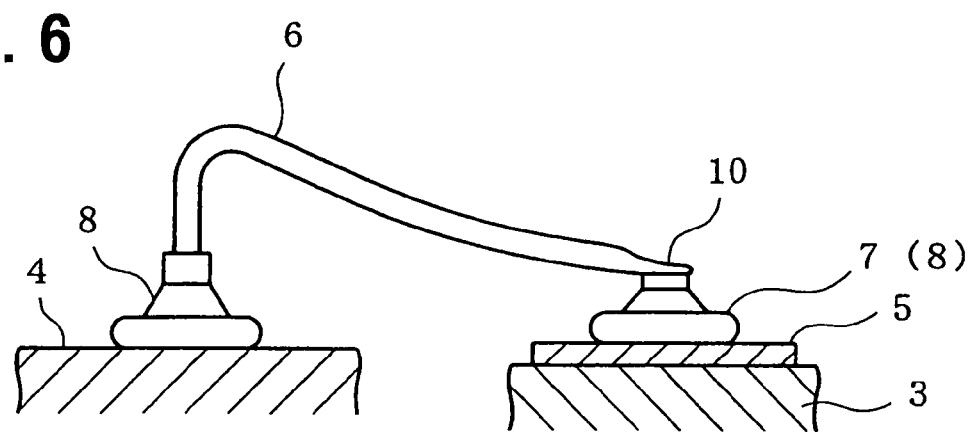
FIG. 6 is a vertical-sectional view showing a completed state of wedge-bonding the first Au wire on the bump according to the first embodiment.

Next, as shown in left side in FIG. 5, the capillary 9 bonds another Au ball 8 at the tip of the Au wire 6 on the interconnection 4 by ball-bonding in the same manner as the ball-bonding process shown in FIGS. 2 and 3. Then, the head of the capillary 9 lifts up and moves laterally to be generally above and slightly beyond the chip electrode 5 of the semiconductor chip 3 without cutting the Au wire 6 as shown in FIG. 5. The capillary 9 affixes the Au wire 6 on a vertex part of the bump 7 having an approximately conical shape by wedge-bonding (stitch-bonding), as shown in FIG. 6. The capillary 9 pulls and cuts the Au wire 6 so that the end of the Au wire 6 is wedge-shaped to provide a wedge-bonded part 10 as shown in FIG. 6.

Figure 7A:
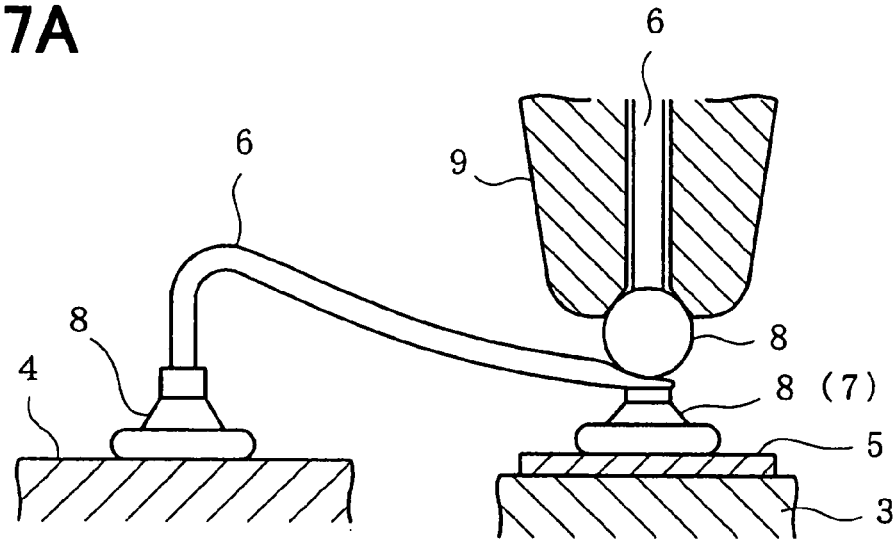
FIG. 7A is a vertical-sectional view showing a first process of ball-bonding an Au wire to form another bump on the bump, whereon the first Au wire has been wedge-bonded beforehand, according to the first embodiment.
Figure 7B:
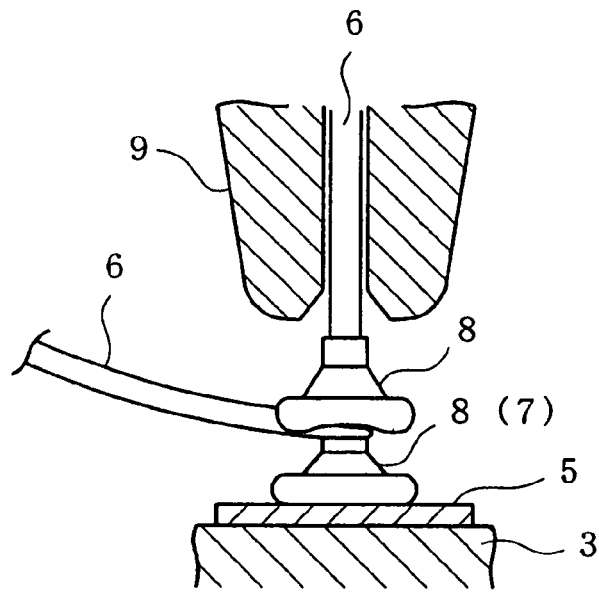
FIG. 7B is a vertical-sectional view showing a second process of forming the other bump on the bump according to the first embodiment.
Figure 7C:
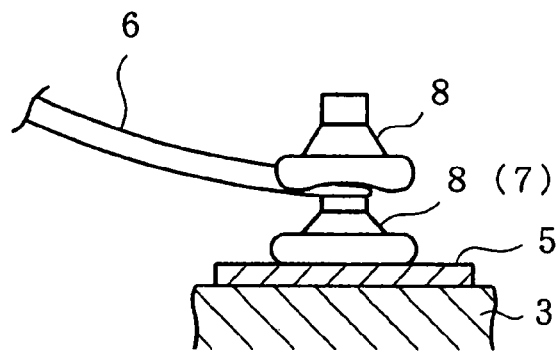
FIG. 7C is a vertical-sectional view showing a completion state of forming the other bump on the bump according to the first embodiment.

Then, as shown in FIGS. 7A to 7C, another bump 7 is affixed by ball-bonding the Au wire 6 on the bump 7 on which the Au wire 6 is already wedge-bonded as described above. Specifically, as shown in FIG. 7A, the capillary 9 for feeding the Au wire 6 forms at a head thereof an Au ball 8 and puts the Au ball 8 down on the wedge-bonded part 10. Then, as shown in FIG. 7B, the capillary 9 affixes the Au ball 8 on the wedge-bonded part 10 plastically deforming the Au ball 8 into a bump 7 having an approximately conical shape in the same manner as the ball-bonding process shown in FIGS. 2 and 3. Concurrently, the capillary 9 deforms a bottom part of the bump 7 into a shape engaged with the bump 7 under the wedge-bonded part 10. Here, the two bumps 7 approximately align on a line perpendicular to a surface of the chip electrode 5. The capillary 9 pulls and cuts the Au wire 6 off the bump 7 to form a stacked bumps 7 as shown in FIG. 7C. Here, the head of capillary 9 is lifted by a predetermined height and then moved laterally and slightly closer to the wedge-bonded part 10.

Figure 8:
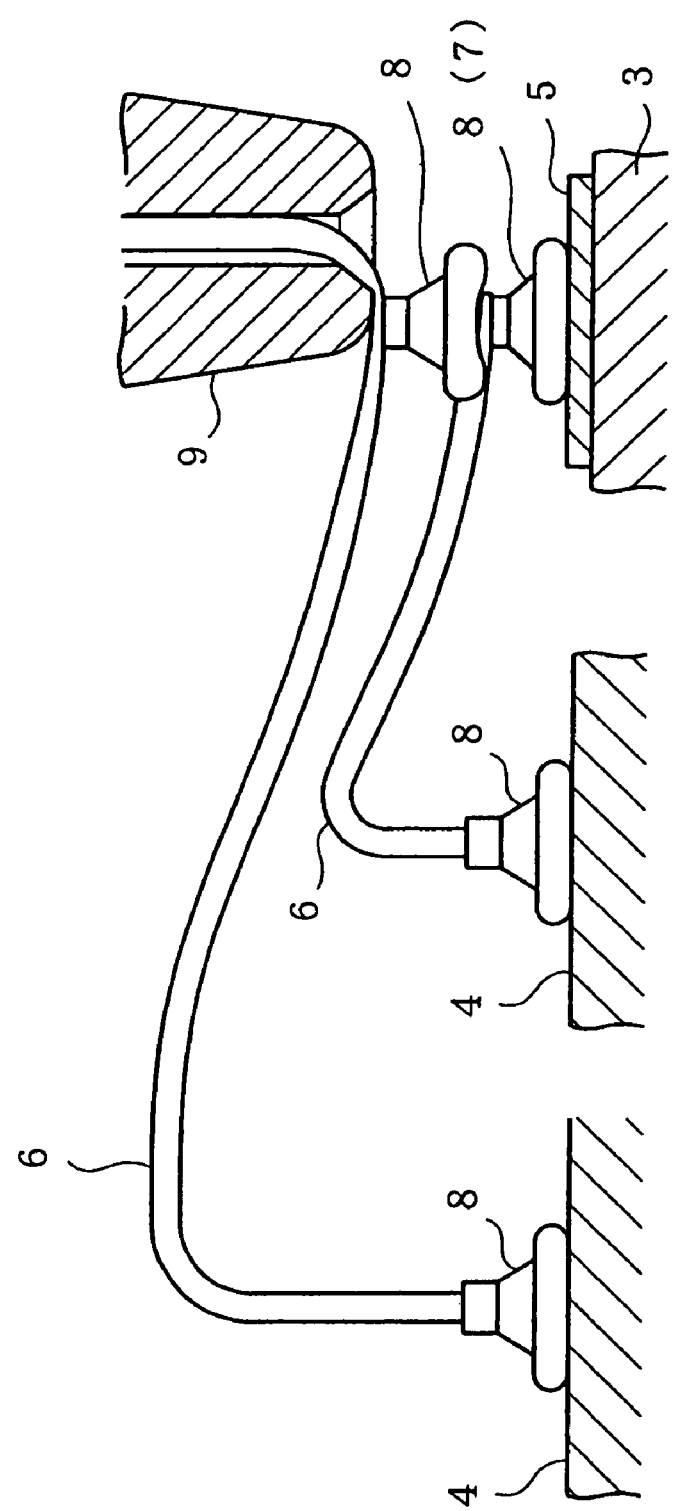
FIG. 8 is a vertical-sectional view showing a process of ball-bonding a second Au wire on a pad portion and wedge-bonding the second Au wire on the other bump, whereon the Au wire has been ball-bonded beforehand, according to the first embodiment.

Further, the capillary 9 bonds a second Au wire 6 between the interconnection 4 and the stacked bumps 7 of the Au balls 8 as shown in FIG. 8. Specifically, the capillary 9 affixes the tip of the Au wire 6 on a portion of the interconnection 4, by forming at a head thereof an Au ball 8 with the Au wire 6 and pushes the Au ball 8 thereon. Then, the capillary 9 lifts up and moves laterally to be generally above and slightly beyond the bump stack. The capillary 9 pushes to affix the Au wire 6 on the stacked bumps by wedge-bonding. The capillary 9 lifts up to cut the Au wire 6 off the wedge-bonded part.

The capillary 9 bonds a third Au wire 6 between the interconnection 4 and the stacked bumps of the Au balls 8 to be a state shown in FIG. 1. Specifically, the capillary 9 forms the Au ball 8 and pushes the Au ball 8 down on the stacked bumps of the Au balls 8 in the same manner as the bonding-process shown in FIGS. 7A to 7C. Then, the capillary 9 bonds the Au wire 6 between a portion of the interconnection 4 and the stacked bumps of the Au balls 8 in the same manner as the wedge-bonding process shown in FIG. 8. As described above, the capillary 9 bonds three Au wires 6 between the interconnection 4 and the chip electrode 5 on the semiconductor chip 3.

According to the first embodiment, it is possible to decrease the number of chip electrodes 5 on the semiconductor chip 3, by stacking three Au balls 8 so as to affix the same number of Au wires 6 on one chip electrode 5. This serves to manufacture the semiconductor chip 3 and the semiconductor device enclosing the semiconductor chip 3 in a small area.

Further, the first embodiment enables to easily affix more than three Au lines 6 on one chip electrode 5 of the semiconductor chip 3, by repeating in turn the process of ball-bonding the Au ball 8 on another Au ball 8 on which the Au wire is wedge-bonded, and the process of wedge-bonding the Au wire 6 whose tip is ball-bonded on the interconnection 4. This configuration serves to decrease the number of electrodes 5 on the semiconductor chip 3 and to manufacture the semiconductor chip in smaller dimensions.

Furthermore, in the first embodiment, the three bumps 7 on the chip electrode 5, which are deformed to be engaged with each other and approximately aligned on the line perpendicular to the surface of the chip electrode 5, are firmly fixed to each other so as not to come apart by an external force such as an impact, In the first embodiment, three Au wires 6 are bonded to connect the interconnection 4 and the chip electrode 5, whereas, the present invention does not limit the number of bonding wires. Two or more than three Au wires 4 can connect the interconnection 4 and the chip electrode 5 by the same method.

Figure 9:
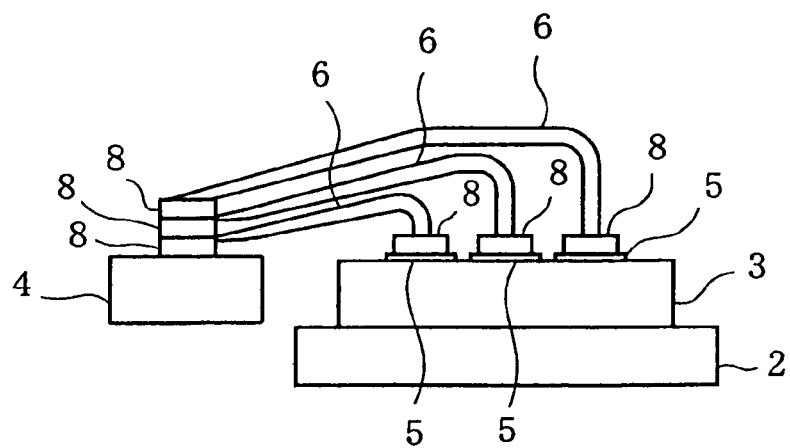
FIG. 9 is a side view showing a semiconductor device manufactured by a manufacturing method of the semiconductor device according to a second embodiment of the present invention.

FIG. 9 depicts a second embodiment of the present invention. In the second embodiment, three Au balls 8, on each of which an Au wire 6 is wedge-bonded, are stacked on the interconnection 4. Stacking the three Au balls 8 on the interconnection 4 and wedge-bonding the Au wire 6 on each of the Au ball 8 is processed substantially in the same manner as in the first embodiment. The other end of the three Au wires 6 are ball-bonded on three chip electrodes 5 provided side by side on a plane on the semiconductor chip 3.

The second embodiment comprises steps of stacking the first bump-shaped Au ball 8 on the interconnection 4, wedge-bonding the first Au wire 6, whose another end is ball-bonded on the first chip electrode 5 on the semiconductor chip 3, on each Au ball 8 stacked on the interconnection 4. The above stacking process and the connecting process are alternately repeated for the second and the third sets.

The second embodiment has the same configurations as those in the first embodiment except for the part described above.

According to the second embodiment, it is possible to manufacture the interconnection 4 in a small area, by affixing or stacking the three Au wires on one portion of the interconnection 4.

Figure 10:
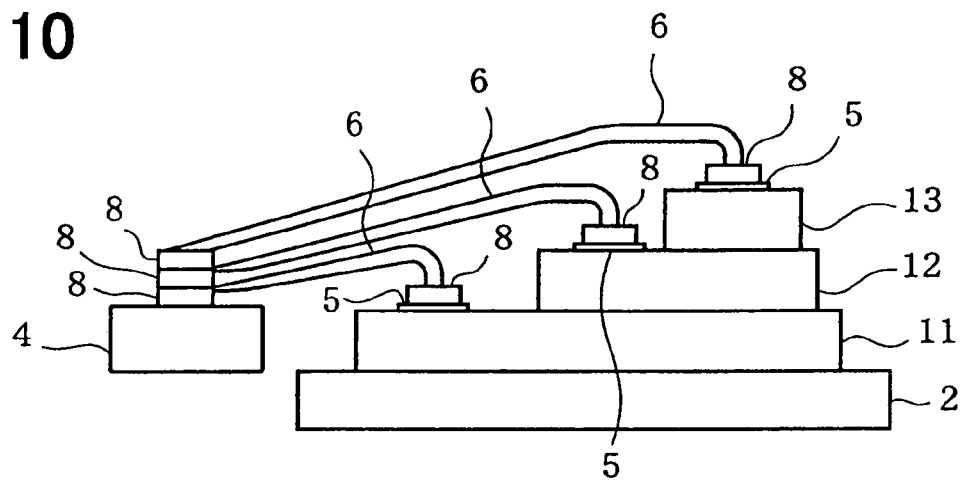
FIG. 10 is a side view showing a semiconductor device manufactured by a manufacturing method of the semiconductor device according to a third embodiment of the present invention.

FIG. 10 depicts a third embodiment of the present invention, wherein a bottom, a middle and a top semiconductor chips 11, 12, 13 are stacked on an island 2. A first Au wire 6 connects an interconnection 4 and an Au ball 8 ball-bonded on a chip electrode 5 on the bottom semiconductor chip 11. A second Au wire 6 connects the interconnection 4 and an Au ball 8 ball-bonded on a chip electrode 5 on the middle semiconductor chip 12. A third Au wire 6 connects the interconnection 4 and an Au ball 8 ball-bonded on a chip electrode 5 on the top semiconductor chip 13.

The third embodiment, which has the same configurations as those of the second embodiment except for the part described above, has advantages equivalent to those of the second embodiment. In the third embodiment, three semiconductor chips 11, 12 and 13 are stacked on the island 2, however the number of the stacked semiconductor is not limited to three. Two or more than three semiconductors can be stacked by the same method.

Figure 11:
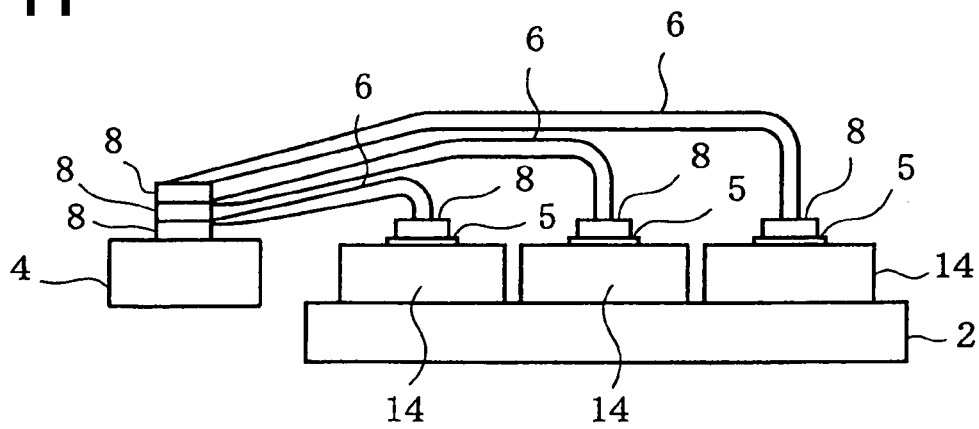
FIG. 11 is a side view showing a semiconductor device manufactured by a manufacturing method of the semiconductor device according to a fourth embodiment of the present invention.

FIG. 11 depicts a fourth embodiment of the present invention, wherein three semiconductors are located side by side on an island 2, that is, the semiconductors 14 are arranged in a multi-chip structure. A first Au wire 6 connects a bottom Au ball 8 on an interconnection 4 and a chip electrode 5 on a left semiconductor chip 14. A second Au wire 6 connects a middle Au ball 8 on the interconnection 4 and a chip electrode 5 on a middle semiconductor chip 14. A third Au wire 6 connects a top Au ball 8 on an interconnection 4 and a chip electrode 5 on a right semiconductor chip 14.

The fourth embodiment, which has substantially the same configuration as that of the second embodiment, has advantages equivalent to those of the second embodiment. In the fourth embodiment, three semiconductor chips 14 are arranged side by side on the island 2, however two or more than three semiconductors can of course be arranged side by side on the island 2.

Figure 12:
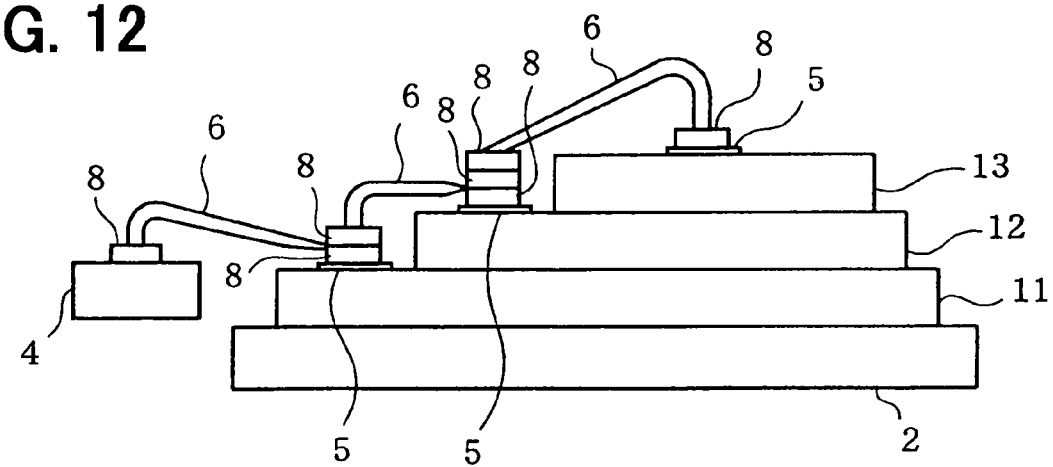
FIG. 12 is a side view showing a semiconductor device manufactured by a manufacturing method of the semiconductor device according to a fifth embodiment of the present invention.

FIG. 12 depicts a fifth embodiment of the present invention, wherein three semiconductor chips 11, 12, 13 are stacked on an island 2 in the same manner as that of the third embodiment. In this embodiment, two Au balls 8 are stacked on a chip electrode 5 located on a top surface of a bottom semiconductor chip 11 and not covered by a middle semiconductor chip 12. Similarly, three Au balls 8 are stacked on a chip electrode 5 located on a top surface of the middle semiconductor chip 12 and not covered by a top semiconductor chip 13.

Here, a first Au wire 6 is ball-bonded on an interconnection 4 and wedge-bonded on an Au ball 8, which is ball-bonded on the chip electrode 5 of the bottom semiconductor 11, to connect therebetween. A second Au wire 6 is ball-bonded on the Au ball 8, whereon the first Au wire 6 is wedge-bonded, and wedge-bonded on an Au ball 8, which is ball-bonded on the chip electrode 5 of the middle semiconductor 12, to connect therebetween. A third Au wire 6 is ball-bonded on the Au ball 8, whereon the second Au wire 6 is wedge-bonded, and wedge-bonded on an Au ball 8, which is ball-bonded on the chip electrode of the top semiconductor 12, to connect therebetween.

The fifth embodiment, which has substantially the same configuration as that of the third embodiment, has advantages equivalent to those of the third embodiment. Especially the fifth embodiment has a further advantage of preventing a malfunction of the semiconductor device caused by the Au wires 6 coming in contact with edges of the semiconductor chips 11, 12 and 13, by comprising a structure of stacking two Au balls 8 on the chip electrode 5 of the bottom semiconductor chip 11 and stacking three Au balls 8 on the chip electrode 5 of the middle semiconductor chip 12. Thus, the fifth embodiment serves to improve design flexibility in arranging the chip electrodes 5 on the semiconductor chips 11, 12 and 13.

Figure 13:
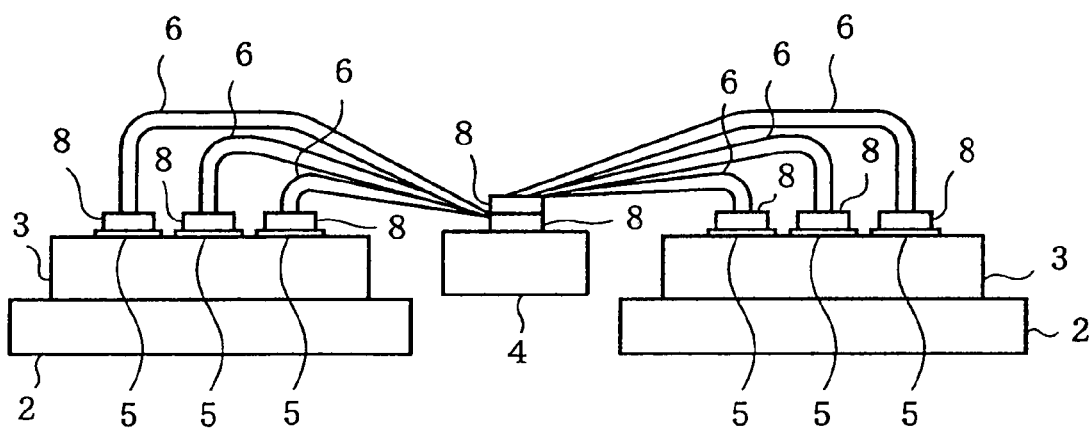
FIG. 13 is a side view showing a semiconductor device manufactured by a manufacturing method of the semiconductor device according to a sixth embodiment of the present invention.

FIG. 13 depicts a sixth embodiment of the present invention that has a left and a right semiconductors 3 and an interconnection located between the semiconductors 3. The semiconductors 3 are separately located on an island 2. A bottom and a top Au balls 8 are stacked on the interconnection 4. Each of the left and the right semiconductor chips 3 has three chip electrodes 5 thereon. Each of three Au wires 6 is boll-bonded one by one on each of the chip electrodes 3 of the left semiconductor chip 3. The other tips of the three Au wires are wedge-bonded on the bottom. Au ball 8, which is ball-bonded on the interconnection 4. An Au ball 8 is respectively boll-bonded on the Au ball 8, whereon the first Au wires are wedge-bonded. Other three Au wires 6 are boll-bonded one by one on the chip electrodes 3 of the right semiconductor chip 3, and wedge-bonded on the top Au ball 8, which is ball-bonded on the bottom Au ball 8.

The sixth embodiment has a configuration of stacking two Au balls 8 on the interconnection 4, however the number of the Au balls stacked an the interconnection 4 is of course not limited to that specified. For example, six Au balls 8, whereon each of the Au wires 6 are wedge-bonded, can be stacked on the interconnection 4.

The sixth embodiment has a configuration of stacking two Au balls 8 on the interconnection 4, however the number of the Au balls stacked on the interconnection 4 is of course not limited to a specific one. For example, six Au balls 8, whereon each of the Au wires 6 are wedge-bonded, can be stacked on the interconnection 4.

Figure 14:
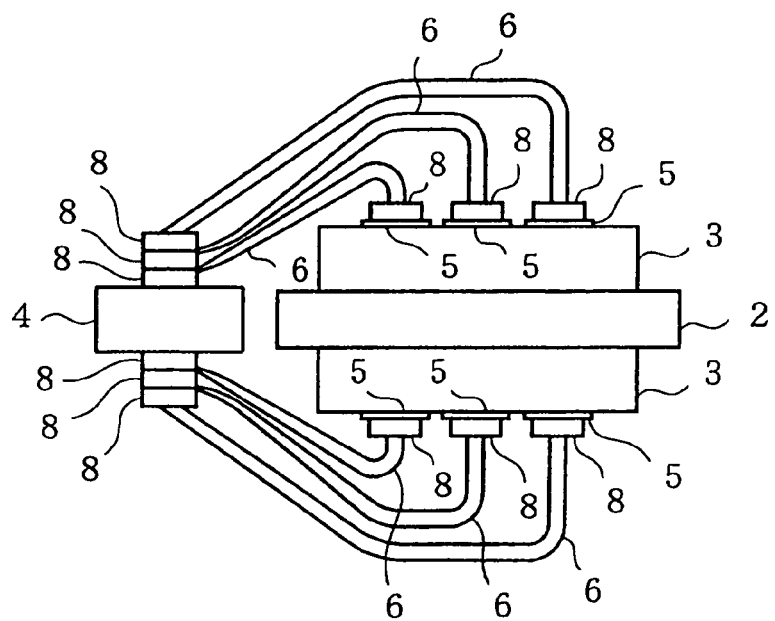
FIG. 14 is a side view showing a semiconductor device manufactured by a manufacturing method of the semiconductor device according to a seventh embodiment of the present invention.

FIG. 14 depicts a seventh embodiment of the present invention, wherein two semiconductor chips 3 are located on both sides of an island 2. Specifically, two semiconductor chips 3 are located on an upper and a lower surfaces of the island 2, and three Au balls 8 are stacked on each of an upper and a lower surfaces of an interconnection 4. Each of three Au wires 6 is wedge-bonded one by one on each of the three Au balls 8 on the upper surface of the interconnection 4. The other tip of each three Au wires is ball-bonded one by one on three chip electrodes 5, which is on the semiconductor chip 3 on the upper surface of the island 2. Other three Au wires 6 connect in the same manner the three chip electrodes 5 of the semiconductor chip 3 on the lower surface of the island 2 and the three Au balls 8 on the lower surface of the interconnection 4.

The seventh embodiment, which has substantially the same configuration as that of the fourth embodiment except for the portions in the above description, has advantages equivalent to those of the fourth embodiment. Especially the sixth embodiment has a further advantage for making the island 2 and the interconnection 4 to be small, by locating two semiconductor chips 3 on both surfaces of the island 2.

This description of the invention is merely exemplary in nature and, thus, variations that do not depart from the gist of the invention are intended to be within the scope of the invention. Such variations are not to be regarded as a departure from the spirit and scope of the invention.

What is claimed is:

1. A semiconductor device comprising:
   a semiconductor chip having a chip electrode;
   an interconnection electrode;
   a first conducting ball bonded to a first bonding point on a first electrode, which is one of the chip electrode and the interconnection electrode;
   a first conducting wire, one end of which is ball-bonded to a second bonding point on a second electrode, and the other end of which is stitch-bonded to the first conducting ball, the second electrode being the other of the chip electrode and the interconnection electrode;
   a second conducting ball bonded to the first conducting ball so that the first conducting ball is sandwiched between the second conducting ball and the first electrode; and
   a second conducting wire, one end of which is ball-bonded to a third bonding point on the second electrode, and the other end of which is stitch-bonded to the second conducting ball,
   wherein the second conducting wire extends generally in the same direction as the first conducting wire does, and
   wherein the third bonding paint is further from the first bonding point than the second bonding point is.

2. The semiconductor device according to claim 1, wherein surfaces of the chip electrode and the interconnection electrode are generally aligned with each other.

3. The semiconductor device according to claim 1, further comprising:
   a third conducting ball bonded to the second conducting ball so that the second conducting ball is sandwiched between the first conducting ball and the third conducting ball; and
   a third conducting wire, one end of which is ball-bonded to a fourth bonding point on the second electrode, and the other end of which is stitch-bonded to the third conducting ball,
   wherein the third conducting wire extends generally in the same direction as the first conducting wire does, and
   wherein the fourth bonding point is further from the first bonding point than the third bonding point is.

4. The semiconductor device according to claim 1, wherein the first and second conducting balls are aligned on an axis vertical to a surface of the first electrode.

5. The semiconductor device according to claim 1, wherein the first conducting ball has a generally conical shape with a vertex portion that bites into the second conducting ball.

* * * * *